United States Patent [19]

Angott

[11] Patent Number: 4,548,554
[45] Date of Patent: Oct. 22, 1985

[54] CEILING FAN CONTROL BOX

[76] Inventor: Paul G. Angott, 457 Hurst, Troy, Mich. 48098

[21] Appl. No.: 604,152

[22] Filed: Apr. 26, 1984

[51] Int. Cl.⁴ ............................................. F04B 21/00
[52] U.S. Cl. ...................................... 417/572; 29/846; 174/54; 340/696; 361/399; 362/96; 415/5; 415/170 R
[58] Field of Search ............... 174/54, 61; 340/825.69, 340/825.72, 696; 362/96; 361/395, 399, 384, 377; 29/846, 848, 849; 416/5, 170 R; 98/40 D, 40 DL; 417/572, 410, 53

[56] References Cited

U.S. PATENT DOCUMENTS

| | | | |
|---|---|---|---|
| 3,356,840 | 12/1967 | Cohen | 174/54 |
| 3,689,927 | 9/1972 | Boston | 340/825.72 |
| 3,800,020 | 3/1974 | Parfet | 29/849 X |
| 4,371,814 | 2/1983 | Hannas | 318/345 D |
| 4,394,708 | 7/1983 | Kasprzyk | 361/399 |
| 4,402,649 | 9/1983 | Laurel | 416/5 |
| 4,465,956 | 8/1984 | Fowler | 318/268 |

Primary Examiner—Edward K. Look
Attorney, Agent, or Firm—Harold W. Milton Jr.

[57] ABSTRACT

A control box (10) for a ceiling fan including a housing (12) having front and rear faces (14,16) and a chamber (18) within the housing (12) for containing a remote control circuit (20) and an antenna (22). A slot (24) extends into and through the housing (12) for disposing the housing (12) around a support post (26) of the ceiling fan. Fasteners (46,62) mount the housing (12) on the ceiling fan support structure (34). A variety of O-rings (52,58,60) can be used to adapt the housing (12) to other ceiling fan support structures. A method of making a remote control (10,90) for remotely operating a ceiling fan includes the steps of printing a circuit for a remote control transmitter (90) and a second circuit for a remote control receiver (10) on a single circuit board (96), separating the portion of the circuit board supporting the transmitter circuit (94) from the receiver circuit (20), mounting the transmitter circuit (94) within a first housing (90), and mounting the receiver circuit (20) within a second housing (12).

18 Claims, 11 Drawing Figures

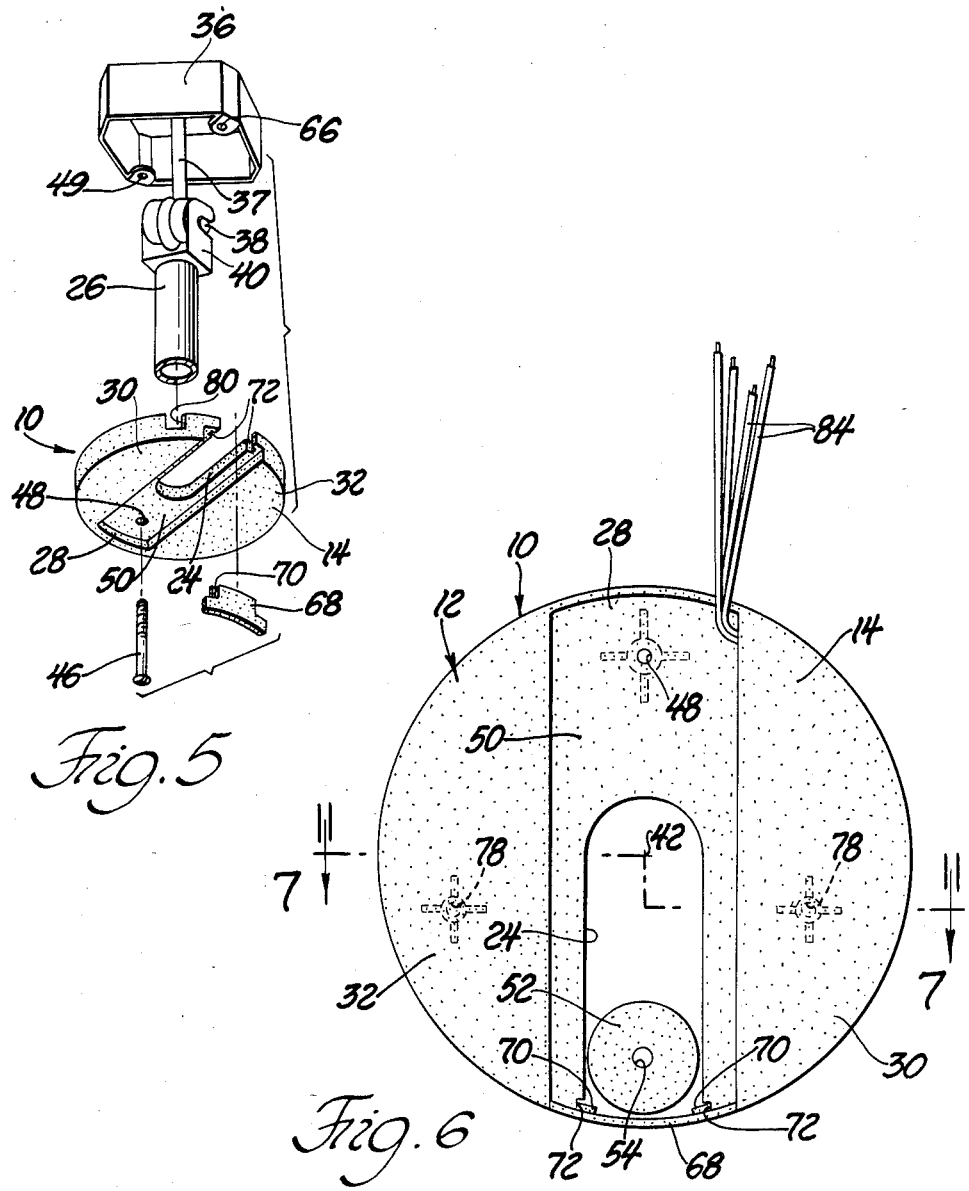
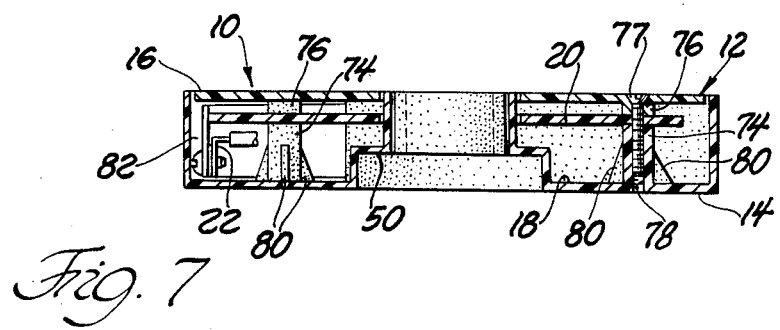
Fig. 5
Fig. 6
Fig. 7

CEILING FAN CONTROL BOX

TECHNICAL FIELD

The subject invention relates to ceiling fan assemblies of the type constructed to be mounted from a ceiling support structure, the assembly including a motor driven fan and a light fixture operatively connected thereto. More specifically, the instant invention relates to a control box and method of making the same for housing a remote control circuit of a receiver for remote control of the fan assembly.

BACKGROUND ART

Ceiling fan assemblies include a support structure mounted on a ceiling and a motor and fan assembly supported therefrom. The motor is operatively connected to either a wall mounted actuator switch or a pull string switch extending from the fan assembly. It is often desirable but presently not possible to actuate the fan from a location remote therefrom. Copending application Ser. No. 604,219 filed Apr. 26, 1984 in the name of applicant discloses a mechanism and circuit for remotely operating a ceiling fan assembly. Means are necessary for effectively and aesthetically housing the circuit proximately to the fan assembly. Further, the assembly must be adapted to the various fan constructions. For example, some fan assemblies include a mounting rod which extends from the ceiling support structure. Other assemblies include a simple screw mounting bracket of various sizes. Finally, the assembly must be economically feasible to manufacture; that is, the assembly must be made in an efficient manner.

STATEMENT OF THE INVENTION AND ADVANTAGES

According to the present invention, there is provided a control box for a ceiling fan including a housing having front and rear faces and a chamber within the housing for containing a remote control circuit and an antenna. Slot means extend into and through the housing for disposing the housing around a support post of the ceiling fan. Mounting means mount the housing on a ceiling fan support structure. The present invention further provides a method of making the remote control including the steps of printing a first circuit for the remote control transmitter and a second circuit for a remote control receiver on a single circuit board, separating the portion of the circuit board supporting the transmitter circuit from the receiver circuit, mounting the transmitter circuit within a first housing, and mounting the receiver circuit within a second housing.

The instant invention provides a control box which can be mounted between the fan assembly and the ceiling fan support structure and adapted to various fan designs while also being aesthetically pleasing. The instant invention further provides a method for efficiently manufacturing the circuitry for the remote control transmitter and receiver simultaneously.

FIGURES IN THE DRAWINGS

Other advantages of the present invention will be readily appreciated as the same becomes better understood by reference to the following detailed description when considered in connection with accompanying drawings wherein:

FIG. 5 is an exploded perspective view of the instant invention shown with a second embodiment of a ceiling fan support structure;

FIG. 6 is an enlarged plan view of the front face of the instant invention;

FIG. 7 is a cross sectional side view taken substantially along lines 7—7 of FIG. 6;

DETAILED DESCRIPTION OF THE DRAWINGS

Figure 1:
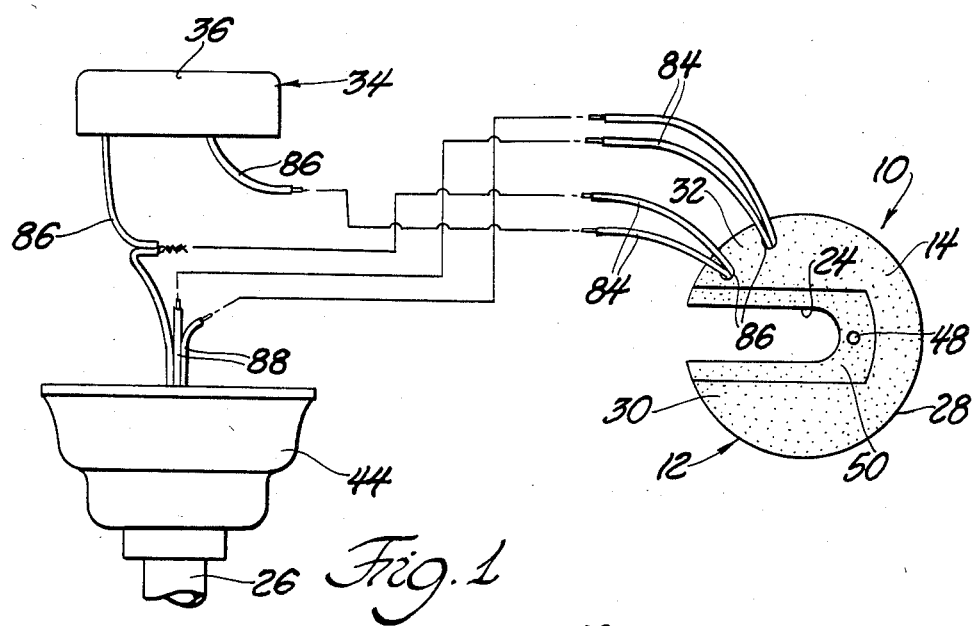
FIG. 1 is a front plan view of the instant invention operatively connected to a ceiling fan assembly.

A control box for a ceiling fan constructed in accordance with the instant invention is generally shown at 10 in the Figures. The control box 10 includes a housing generally indicated at 12 having a front face 14 and a rear face 16. Within the housing 12 is a chamber 18 for containing a remote control circuit 20 which is shown mounted within the chamber 18 in FIG. 7. An antenna 22 is also mounted within the chamber 18. A slot 24 extends into and through the housing 12 for disposing the housing 12 around a support rod 26 of a ceiling fan as shown in FIG. 5. The control box 10 further includes mounting means for mounting the housing 12 on a ceiling fan support structure as will be detailed below.

Figure 4:
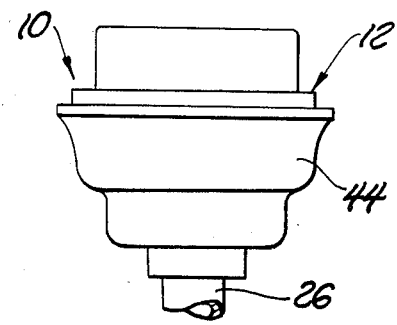
FIG. 4 is a side view of the assembled instant invention.

More specifically, the housing 12 is substantially U-shaped and has a base portion 28 and two legs 30,32 defining the slot 24 therebetween. As shown in FIG. 5, a ceiling fan support structure generally indicated at 34 includes a mounting box 36 which is adapted to be disposed flush within a hole made in a ceiling and secured thereto. A post 37 descends from the box 36 and includes a hanger 38 at the end thereof. The support rod 26 includes a hanger bracket 40 at the end thereof which is mounted upon the hanger 38. The housing 12 includes the slot 24 defined by the legs 30 and 32 of the housing which are spaced so that the housing 12 can be disposed about the support rod 26 by disposing the support rod 26 within the slot 24. The housing 12 has an axial center shown at 42 in FIG. 6, the slot 24 extending radially into the housing 12 beyond the center 42 thereof. The support rod 26 or post 27 is disposed within the slot 24 so as to be positioned at the axial center 42. Since the slot 24 extends beyond the axial center 42 of the housing 12, the housing 12 can be centered relative to the remainder of the fan assembly as shown in FIG. 4. A canopy 44 is disposed over the housing 12 as the support rod 26 extends therefrom the motor and fan assembly would be mounted on the other end of the support rod 26.

The mounting means includes fasteners, commonly in the form of a screw 46 which is inserted through an opening 49 in the base portion 28 of the housing 12 to be threadably engaged within an opening 48 in the box 36. The canopy 44 is then secured over the housing 12 so that the housing 12 is substantially concealed within the canopy 44, as shown in FIG. 4.

Other ceiling fan support assemblies include small brackets which are generally secured by screws to the box 36. The front face 14 of the housing 12 includes a recessed portion 50 defining a shoulder extending about the slot 24 and having a seating surface for seating such a ceiling fan support bracket thereon. The recessed portion 50 extends along each of the legs 30,32 and into the base portion 28. For this purpose, the mounting means includes two fasteners for securing the support bracket onto the seating surface of the recessed portion 50. The control box 10 includes spacer means 52 disposed within the slot 24 for presenting a support surface against the ceiling fan support bracket within the slot 24. One of the fasteners extends through the bracket and the opening 54 in the spacer means 52 to fixedly secure the spacer means 52 between the bracket and the ceiling fan support structure 34. The other fastener would extend through the bracket and opening 48 in the base portion 28 of the housing 12 to secure the bracket, and housing 12 to the box 36.

The spacer means 52 may take the form of an O-ring member 52 disposed within the slot 24. The O-ring member 52 and the slot 24 have substantially equal thickness or depth so that the surface of the O-ring member 52 is substantially flush with the seating surface of the recessed portion 50. The O-ring member 52 presents a support surface for the bracket while it is maintained in position by the fastener that extend therethrough. The fastener provides the function of securing the bracket and O-ring member and housing 12 onto the box 36.

Figure 2:
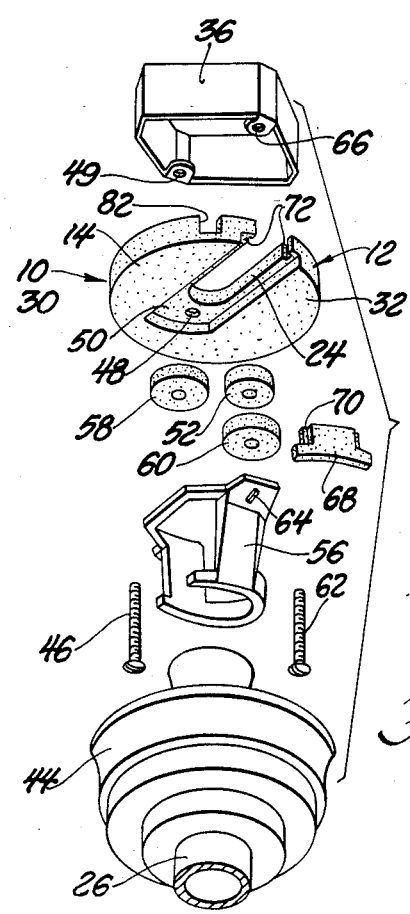
FIG. 2 is an exploded perspective view of the instant invention.
Figure 3:
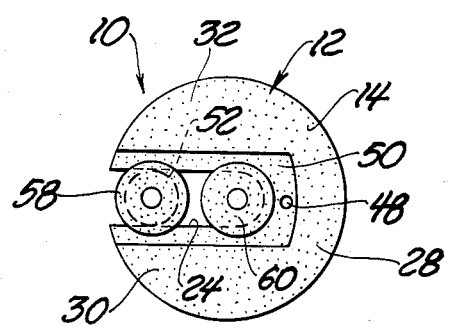
FIG. 3 is a plan view of the front face of the instant invention.

The instant invention may be adapted to support a third support bracket structure, as shown in FIG. 2. In this embodiment, the support bracket 56 is too wide to fit within the recessed portion 50 of the housing 12. Second spacer means are disposed within the recessed portion 50 and upon the seating surface thereof for presenting a support surface which is flush with the remainder of the front face 14 of the housing 12. As stated above, the mounting means includes an opening 48 extending through the base portion 28 of the housing 12 and within the recessed portion 50. The second spacer means includes a second O-ring member 58 which is disposed over the opening 48 and a third O-ring member 60 disposed over the first mentioned O-ring member 52. The O-ring members 58,60 have a thickness equal to the depth of the recessed portions 50. When inserted within the recessed portion, the O-ring members 58 and 60 present a mounting surface flush with the remainder of the front face 14 of the housing 12. In this manner, the housing 12 can be adapted to have the bracket 56 mounted thereupon.

A first of the fasteners 62 extends through the first and third mentioned O-ring members 52 and 60 and through a first opening 64 in the bracket 56 so as to threadably engage the second opening 66 in the base 36. The second of the fasteners 46 extends through a second opening in the bracket 56 (not shown) and through the second O-ring member 58 and the opening 48 to threadably engage the opening 49 in the box 36. Thus, a single housing 12 constructed in accordance with the instant invention can be used to mount a variety of ceiling fan support brackets simply by the use of the slot 24 and O-ring members 52, 58, and 60.

The control box 10 includes closure means for closing the end of the slot 24 between the two legs 30 and 32 of the housing 12 to define a continuous other side wall of the housing 12. The closure means comprises a curved gate member 68 having legs 70 projecting therefrom which engage slots 72 in the housing 12.

The control box 10 includes a substantially U-shaped circuit board receiver 20 supported within the chamber 18. The front and rear faces, 14,16 respectively, of the housing 12 have opposite faces within the chamber 18 including hollow tubular projects 74,76 extending into the internal chamber 18 therefrom, as shown in FIG. 7. The projections 74 of the front face 14 are symmetric with the projections 76 of the rear face 16 to define openings for receiving fasteners 77 for securing the circuit board receiver 20 within the chamber 18. The circuit board receiver 20 is clamped between the projects 74 of the front face 14 and the projections 76 of the rear face 16 of the housing 12. The circuit board 20 has openings 78 corresponding to the openings in the housing 12 for receiving the fasteners 77 therethrough.

Radially projecting ribs 80 extend from the projections 74 of the opposite side of the front face 14, the ribs 80 being integral with the opposite side of the front face 14 to support the projections 74 within the chamber 18.

The side walls of the housing 12 include at least one opening 82 for allowing access to the antenna 22, as shown in FIGS. 2 and 5.

The housing 12 includes a bottom member defining the front face 14 and the side walls of the housing 12 and a lid member defining the rear face 16 of the housing 12. The housing 12 has a substantially round outer periphery. Wires 84 extend through openings 86 in the front face 14 of the housing 12 as shown in FIG. 1 or the wires 84 may extend through an opening in the recessed portion 50 as shown in FIG. 6. As shown in FIG. 1, the wires 84 extending from the receiver circuit board 20 are operatively connected to wires 86 extending from the box 36 and wires 88 extending from the fan assembly.

Thus, the instant invention provides a combination of a ceiling fan assembly and receiver device 10 for receiving radio transmissions to remotely control the ceiling fan, the combination including a ceiling fan mounted on the support rod 26, a ceiling fan support structure generally indicated at 34, and the remote control receiver 20 mounted between the ceiling fan support structure 34 and the ceiling fan assembly. The receiver includes the housing 12 having an internal chamber 18, the receiver further including a remote control circuit board 20 and an antenna 22 supported within the chamber 18 operatively connected to the fan assembly.

Figure 8:
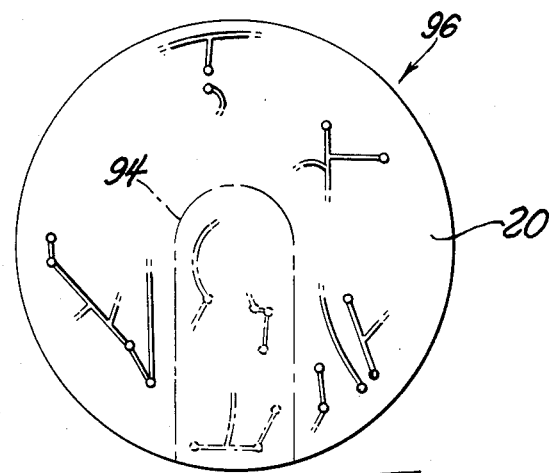
FIG. 8 is a schematic plan view of the combined receiver and transmitter circuit board.
Figure 9:
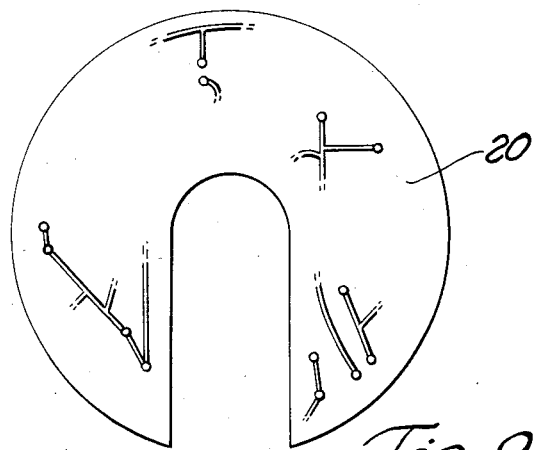
FIG. 9 is a schematic plan view of the circuit for the receiver of the instant invention.
Figure 10:
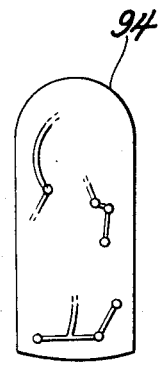
FIG. 10 is a schematic plan view of the circuit board for the transmitter of the instant invention.
Figure 11:
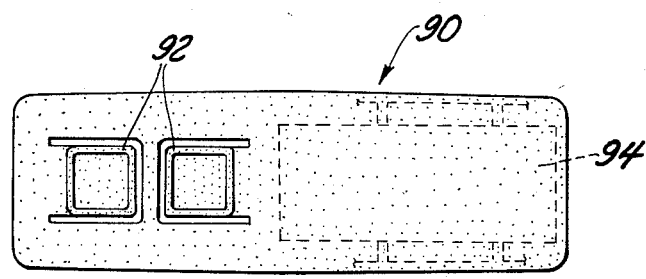
FIG. 11 is a plan view of the front face of the transmitter of the instant invention.

The receiver circuit 20 is actuated by a transmitter generally shown at 90 in FIG. 11. The transmitter 90 includes control buttons 92 for operating the assembly from a remote location. A transmitter circuit 94 is mounted within the transmitter 90. The instant invention provides a method of making the remote control assemblies 10 and 90 for remotely operating the ceiling fan. The method includes the steps of printing a circuit for a remote control transmitter and a second circuit for the remote control receiver on a single circuit board generally shown at 96 in FIG. 8. The printed receiver circuit is indicated at 20 and the transmitter circuit is indicated at 94. As shown in FIGS. 9 and 10 the portion of the circuit board supporting the transmitter circuit 94 is separated from the receiver circuit board 20, as by a punching operation. The transmitter circuit board 94 is mounted within a first housing 90 of the remote control transmitter, and the receiver circuit board 20 is mounted within the housing 12 of the control box 10. The two circuit boards of the corresponding receiver and transmitter can be printed in a single operation thereby eliminating further costly steps of separately printing each board. Further, the transmitter and receiver circuits are printed on a round circuit board 96 and the portion of the circuit board supporting the transmitter is removed from the portion of the circuit board supporting the receiver to form a substantial U-shaped receiver circuit board 20. The transmitter circuit board 94 is then mounted within the rectangular shape transmitter housing 90 and the receiver circuit board 20 is mounted in the U-shaped internal chamber 18 of the substantially U-shaped housing 12 whereby the receiver housing 12 may be mounted about the ceiling fan support rod 26. The method provides a circuit board specifically suited for being secured within the U-shaped housing 12 which is in turn adaptable to the many ceiling fan support structure configurations. Thus, the instant invention provides a housing 12 and circuit board 20 which can be adapted to a variety of ceiling fan structures and can further be manufactured efficiently and at a lower cost.

The invention has been described in an illustrative manner, and it is to be understood that the terminology which has been used is intended to be in the nature of words of description rather than of limitation.

Obviously many modifications and variations of the present invention are possible in light of the above teachings. It is therefore, to be understood that within the scope of the appended claims wherein reference numerals are merely for convenience and are not to be in any limiting, the invention may be practiced otherwise that is specifically described.

What is claimed is:

1. A control box (10) for a ceiling fan comprising: a housing (12) having front and rear faces (14,16); a chamber (18) within said housing (12) for containing a remote control circuit (20) and an antennae (22); slot means (24) extending into and through said housing (12) for disposing said housing (12) around a support rod (26) of the ceiling fan; and mounting means for mounting said housing (12) on a ceiling fan support structure (34).

2. A control box as set forth in claim 1 further characterized by said housing (12) being substantially U-shaped and having a base portion (28) and two legs (30,32) defining said slot means (24) therebetween.

3. A control box as set forth in claim 2 further characterized by said housing (12) having an axial center (42), said slot means (24) extending radially into said housing (12) beyond said center (42) thereof.

4. A control box as set forth in claim 3 further characterized by said front face (14) of said housing (12) including a recessed portion (50) defining a shoulder extending about said slot means (24) and having a seating surface for seating a ceiling fan support bracket thereon, said recessed portion (50) extending along each of said legs (30,32) and into said base portion (28).

5. A control box as set forth in claim 4 further characterized by said mounting means including fasteners (46) for securing a bracket onto said seating surface, said control box (10) including spacer means (52) disposed within said slot means (24) for presenting a support surface against the bracket within said slot means (24), one of said fasteners extending through said spacer means (56) to fixedly secure said spacer means (52) between the bracket and the ceiling fan support structure (34).

6. A control box as set forth in claim 5 further characterized by said spacer means (24) including an O-ring member (52) disposed within said slot means (24), said O-ring member (52) and said slot means (24) having substantially equal thickness.

7. A control box as set forth in claim 5 further characterized by including second spacer means disposed within said recessed portion (50) and upon said seating surface for presenting a support surface which is flush with the remainder of said front face (14) of said housing (12).

8. A control box as set forth in claim 7 further characterized by said mounting means including an opening (48) extending through said base portion (28) of said housing (12) and within said recessed portion (50), said second spacer means including a second O-ring member (58) disposed over said opening (48) and a third O-ring member (60) disposed over said first mentioned O-ring member (52), a first of said fasteners (62) extending through said first and third O-ring members (56,60) and a second of said fasteners (46) extending through said second O-ring member (58) and said opening (48), said second and third O-ring members (58,60) having a thickness equal to the depth of said recessed portion (50).

9. A control box as set forth in claim 4 further characterized by including closure means for closing the end of said slot means (24) between said two legs (30,32) of said housing (12) to define a continuous outer side wall of said housing (12).

10. A control box as set forth in claim 4 further characterized by including a substantially U-shaped circuit board receiver (20) supported within said chamber (18).

11. A control box as set forth in claim 10 further characterized by said front and rear faces (14,16) of said housing (12) having opposite faces including hollow tubular projections (74,76) extending into said internal chamber (18), said projections (74,76) of said front face (14) being symmetric with said projections (76) of said rear face (16) to define said openings for receiving fasteners (77) for securing said circuit board receiver (20) within said chamber (18).

12. A control box as set forth in claim 11 further characterized by said circuit board (20) being clamped between said projections (74,76) of said front and rear faces (14,16) of said housing (12), said circuit board (20) having openings (78) corresponding to said openings in said housing (12) for receiving said fasteners (77) therethrough.

13. A control box as set forth in claim 12 further characterized by including radially projecting ribs (80) extending from said projections (74) of said opposite side of said front face (14), said ribs (80) being integral with said opposite side of said front face (14) to support said projections (74).

14. A control box as set forth in claim 13 further characterized by said side walls including at least one opening (82) for access to the antennas (22).

15. A control box as set forth in claim 12 further characterized by including a bottom member defining said front face (14) and said side walls and a lid member defining said rear face (16) of said housing (12).

16. A control box as set forth in claim 15 further characterized by said housing (12) having a substantially round outer periphery.

17. A method of making a remote control (10,90) for remotely operating a ceiling fan, said method comprising the steps of: printing a circuit for a remote control transmitter and a second circuit for a remote control receiver on a single circuit board (96); separating the portion of the circuit board (96) supporting the transmitter circuit (94) from the receiver circuit (20); mounting the transmitter circuit (94) within a first housing (90); and mounting the receiver circuit (20) within a second housing (12).

18. A method as set forth in claim 17 further defined by printing the transmitter and receiver circuits on a round circuit board (90), removing the portion of the circuit board supporting the transmitter circuit to form a substantially U-shaped receiver circuit board (20), mounting the transmitter circuit (94) within a first housing (90), and mounting the receiver circuit (22) in a U-shaped internal chamber (18) of a substantially U-shaped second receiver housing (12) whereby said receiver housing (12) may be mounted about a ceiling fan support rod (26).

* * * * *